United States Patent
Haldemann

Patent Number: 5,661,410
Date of Patent: Aug. 26, 1997

[54] METHOD AND APPARATUS FOR THE DETECTION OF THE CURRENT DISTRIBUTION IN A CONDUCTOR OF AN ELECTRIC MACHINE

[75] Inventor: Johann Haldemann, Birr, Switzerland

[73] Assignee: Asea Brown Boveri AG, Baden, Switzerland

[21] Appl. No.: 510,311

[22] Filed: Aug. 2, 1995

[30] Foreign Application Priority Data

Sep. 16, 1994 [DE] Germany .................. 44 32 963.6

[51] Int. Cl.$^6$ .................... G01R 31/06; G01R 1/20
[52] U.S. Cl. .................... 324/772; 327/127; 327/545
[58] Field of Search .................. 324/772, 545, 324/127, 117 R, 117 H

[56] References Cited

U.S. PATENT DOCUMENTS

| | | | |
|---|---|---|---|
| 1,522,196 | 1/1925 | MacMillan | 324/772 |
| 3,624,504 | 11/1971 | Joly | 324/772 |
| 3,855,529 | 12/1974 | Langweiler | 324/772 |
| 4,230,961 | 10/1980 | Calfo et al. | 342/772 |
| 4,245,181 | 1/1981 | Plunkett | 324/772 |

OTHER PUBLICATIONS

"Isoliersysteme fur Hydrogeneratoren, Stand der Technik und Betriebserfahrungen", R. Schuler, Brown Boveri Mitt. 2–80, pp. 135–140, Feb. 1980.

"Beruhrungslose Messung und Uberwachung des Luftspaltes elektrischer Maschinen", S. Lebeda, et al., Brown Boveri Mitt. 5–78, pp. 312–317, May 1978.

*Primary Examiner*—Ernest F. Karlsen
*Attorney, Agent, or Firm*—Burns, Doane, Swecker & Mathis, L.L.P.

[57] ABSTRACT

A method and an apparatus for the detection of the current distribution in at least one conductor (W1, W2) of an electric machine are specified, which indirectly permit, in a simple manner, the metrological determination of said distribution. The conductors or Roebel bars (W1, W2) are arranged in a slot (4) of a stator laminate stack (3) of the electric machine and each has a plurality of mutually electrically insulated and transposed conductor elements (W1nl, W1nr; W2nl, W2nr). A probe holder (6) which can be displaced radially with regard to the electric machine and contains, in recesses, 2 magnetic field probes (M1, M2) with a predeterminable center-to-center distance (d) is provided, adjacent to these conductors (W1, W2) in a probe channel (17) within the slot (4). The magnetic transverse field within the slot (4) is measured using said probes. For the purpose of determining the electric current distribution, this magnetic transverse field strength is combined, by multiplication, with a width (b) of the slot (4).

5 Claims, 2 Drawing Sheets

METHOD AND APPARATUS FOR THE DETECTION OF THE CURRENT DISTRIBUTION IN A CONDUCTOR OF AN ELECTRIC MACHINE

BACKGROUND OF THE INVENTION

1. Field of the Invention

The invention is based on a method and an apparatus for the detection of the current distribution in a conductor of an electric machine in accordance with the preamble of patent claims 1 and 3.

2. Discussion of Background

With the preamble of patent claims 1 and 3, the invention refers to a prior art as is disclosed in the Swiss company journal: Brown Boveri Reports 5 (1978), pp. 312–317. In that case, magnetic induction changes, inter alia, are detected by means of induction coils or magnetoresistive components (field plates) for the purpose of direct contactless air gap measurement in rotating electric machines. These magnet probes are encapsulated in an elastic silicone rubber and are bonded in so-called vetresite strips.

The use of so-called Roebel bars, which are named after their inventor Ludwig Roebel and comprise a plurality of insulated conductor elements, for high-voltage windings of rotating electric machines is disclosed in the Swiss company journal: Brown Boveri Reports 2 (1980), pp. 135–140. The conductor elements are transposed in such a way that every conductor element occupies every position within the bar.

Having been induced by the current displacement, eddy currents, which are confined within a solid conductor and contribute nothing to the total current, occur in stator windings of electric machines. So-called loop currents, which circulate within the parallel-connected conductor elements of Roebel bars and make no contribution to the total current of the Roebel bar, are generated in the spaces at the front and back ends of the machine by the electromagnetic field.

In order to be able to use structural countermeasures to minimize the additional current losses produced, it is desired to know the electrical current distribution within the conductor of a winding.

SUMMARY OF THE INVENTION

Accordingly, one object of the invention, as it is defined in patent claims 1 and 3, is to provide a novel method and a novel apparatus for the detection of the current distribution in a conductor of an electric machine of the type mentioned in the introduction which permit the metrological determination of said distribution in a simple manner.

Advantageous refinements of the invention are defined in the dependent patent claims.

One advantage of the invention is constituted by the fact that the current distribution within a conductor can be determined in a simple manner from the field strength distribution of the slot magnetic transverse field. This does not necessitate any intervention in the winding.

The probe channel which is required for measurement can be fitted in a simple manner in electric machines.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENT

Figure 1:
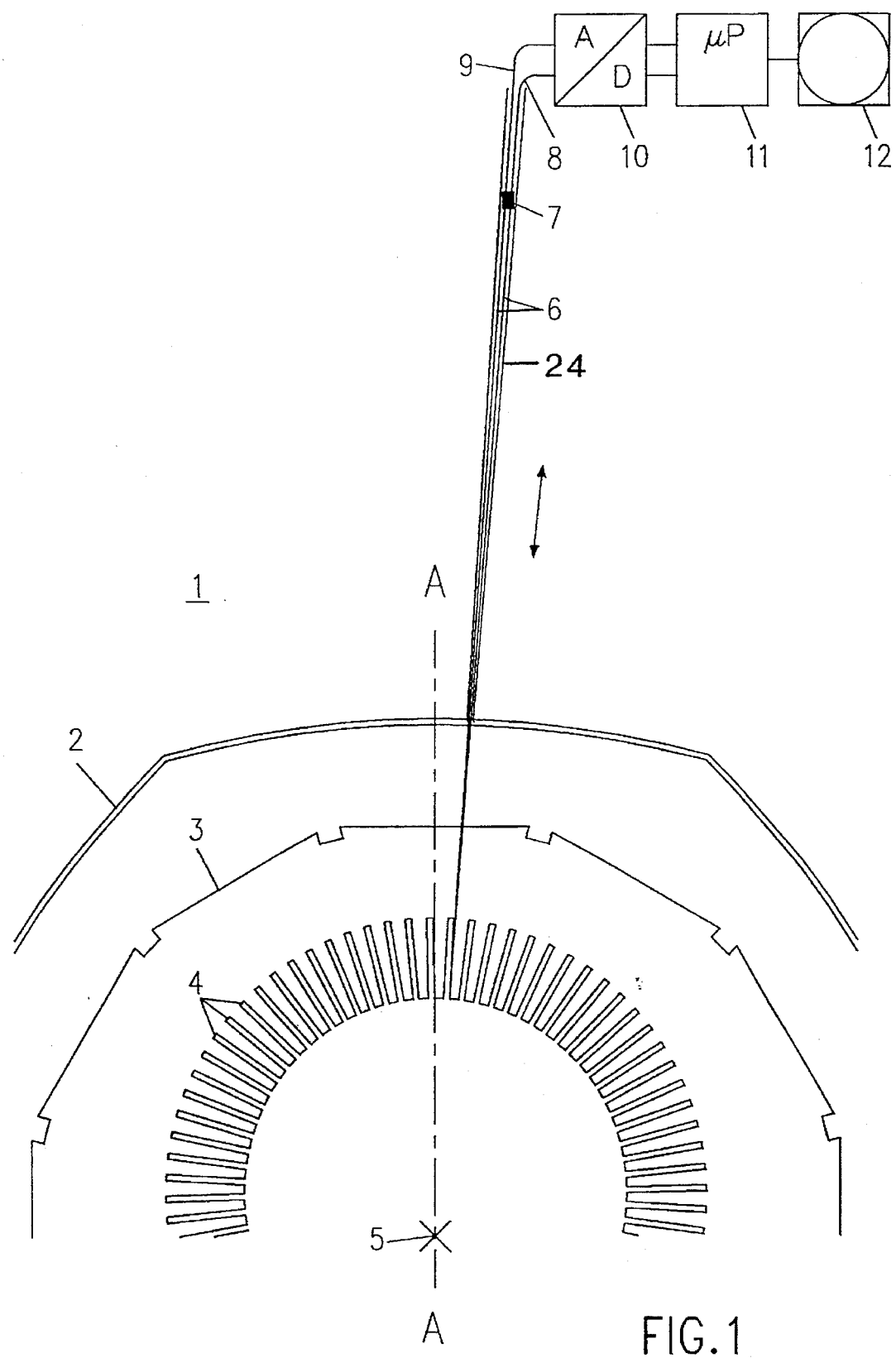
FIG. 1 partially shows a cross section through a stator of a rotating electric machine with a radially arranged magnetic field probe.
Figure 2:
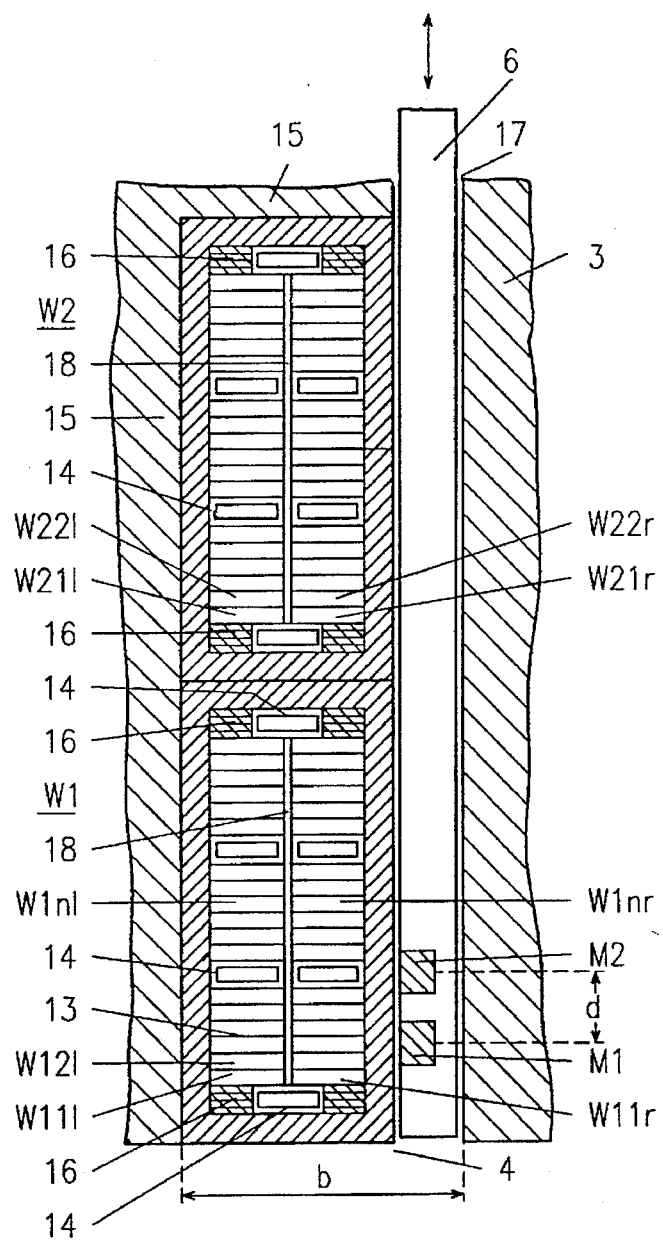
FIG. 2 shows a cross section of 2 Roebel bars in a slot of a stator laminate stack of the machine according to FIG. 1, with a magnetic field probe for detecting the magnetic field strength in the slot.

Referring now to the drawings, wherein like reference numerals designate identical or corresponding parts throughout the several views, FIG. 1 partially shows a cross section of the stator of a rotating electric machine (1), which stator is accommodated in a housing (2). On the rotor side, a stator laminate stack (3) has slots (4) for accommodating stator windings and Roebel bars and conductors (W1, W2), cf. FIG. 2. The vertical direction is indicated by A—A. (5) designates an axis of rotation of a rotor (not illustrated) of the electric machine (1). A radial probe channel (17), cf. FIG. 2, is routed through the housing (2) and the stator laminate stack (3), in which channel a probe bar or probe holder (6) made of an electrically insulating material is arranged such that it can move radially. Electric lines (8, 9) of magnetic field probes, preferably of Hall probes (M1, M2), cf. FIG. 2, are protected against breaking by means of a retention element (7) in a probe guiding tube (24). The electric lines (8, 9) are fed to an analog/digital converter (10) which is connected on the output side to a microprocessor or computer (11). The computing result of the computer (11) is output in an output device or displayed on a display device (12). The devices (10–12) may be combined in one field measuring device.

FIG. 2, which is not to scale, shows a cross section, in a slot (4) of the stator laminate stack (3), of 2 conductors (W1, W2) which are arranged behind one another in the slot (4). The transposition of a conductor (W1, W2) in the slot region is usually 360°; it may also be different. The conductor (W1) has a plurality of left-hand conductor elements (W1ll, W12l, ... W1nl) and just as many right-hand conductor elements (W1lr, W12r, ... W1nr), which are mutually insulated in each case by conductor element insulation (13) and interlayer insulation (18) between the left-hand and right-hand conductor elements. Cooled conductor elements or hollow conductors (14) are arranged after every 6 left-hand and right-hand conductor elements, in order to avoid an excessive temperature rise inside the conductor elements. Water is used as the cooling fluid.

Central hollow conductors (14) at the ends indicate positions of the conductor elements in which the latter change sides. They are surrounded at the edges by an electrically insulating filling (16). The two conductors (W1, W2) have the same structure; the designations of their conductor elements (W1nl, W1nr; W2nl, W2nr) differ only by the indices 1 and 2. Both conductors (W1, W2) are embedded in main insulation (15) made of an electrically insulating plastic. With regard to the production of the conductors (W1, W2), reference is made to the publication cited in the introduction: Brown Boveri Reports 5 (1978), pp. 312–317.

In the slot (4) having a width (b), the probe holder (6) is arranged, such that it can be displaced in the radial direction, in a probe channel (17) between the right-hand main insulation (15) of the conductors (W1, W2) and the right-hand wall of the slot (4). The probe holder (6) preferably has a rectangular cross section with a thickness of 1.5 mm and a width of 5 mm. Magnetic field probes or Hall probes (M1, M2) or field measuring coils with a predeterminable, adjustable mutual center-to-center distance (d) of preferably 7.2 mm, corresponding to the vertical distance of 4 conductor elements (W1nl, W1nr; W2nl W2nr), are let into depressions or recesses (e.g., 2 recesses) in the lower part of the probe holder (6). For the sake of clarity, the electric supply lines, which are likewise let into the probe holder (6), are not illustrated. It is evident that each Hall probe (M1, M2) requires 4 electric supply lines.

Figure 3:
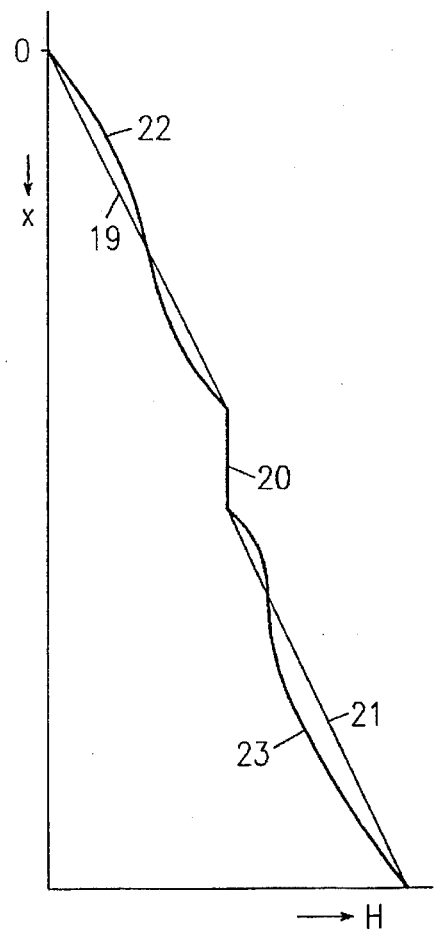
FIG. 3 shows the distribution of the magnetic field strength in the slot according to FIG. 2, with and without loop currents.

In FIG. 3, a magnetic field strength (H) s plotted on the abscissa and a path length (x) in the radial direction is plotted on the ordinate, both in arbitrary units, corresponding to the radial profile of the field distribution in the slot (4) of FIG. 2 which is alongside. In this case, the magnetic field strength (H) has the value 0 at the closed end of the slot (4) and its maximum value at the open lower end. Straight line sections (19–21) show the profile of the magnetic field strength (H) in the case of DC current in the conductors (W1, W2), that is to say without any loop currents. The magnetic field strength (H) does not change in the winding-free region (20). The characteristic profile does not necessarily have to be straight in the case of DC current. Such a nonlinear characteristic profile is then used as a reference for the measurement with loop currents.

In the case of AC currents in the conductors (W1, W2), undesired loop currents occur, caused by non-existent or inadequate transposition of the conductors (W1, W2) at the ends of the stator of the electric machine (1), the effect of which on the magnetic field strength (H) in a slot (4) is indicated by curves (22) and (23).

The smallest increase in the magnetic field strength (H) in the region of the hollow conductors (14) of the conductors (W1, W2) is not taken into account in the curves (19–23), illustrated in a simplified manner, of FIG. 3.

The electric current distribution I(x), which is sought after, within a conductor (W1, W2) is obtained in accordance with:

$$I(x) = \sum_{0}^{x} i = H(x) \cdot b,$$

where i designates the respective current in the conductor elements (W1nl, W1nr; W2nl, W2nr) in the range of the summation limits.

In principle, the electric current distribution I(x) can be determined by means of only one Hall probe (M1), the phase shift of the current (i) having to be taken into account, however, in the event of displacement along the slot (4). This necessity can be a voided by the use of 2 Hall probes (M1, M2) connected differentially. Using these, it is possible, in a simple manner, to detect the change in the magnetic field strength (H) over the path length (x) and evaluate it by means of the field measuring device (10–12).

It is evident that this measurement can also be applied in non-rotating, machines, such as, for example, in linear machines and transformers. It is also possible to provide more than 2 conductors (W1, W2) in a slot (4). The number of conductor elements (W1nl, W1nr; W2nl, W2nr) within a conductor (w1, w2) may differ from the number illustrated in FIG. 2. Hollow conductors (14) do not necessarily have to be provided inside a conductor (W1, W2).

What is important is that it is possible to undertake indirect detection of each conductor element current (i) without the necessity of undertaking structural intervention in the conductor (W1, W2) itself. For this purpose, the physical property of electrical conductors (W1, W2) in a metallic slot (4) made of a permeable material is utilized, this property being that the slot magnetic transverse field is a reflection of the electric current distribution I(x) in the conductor (W1, W2). The electric current distribution I(x) is therefore detected indirectly by measuring the magnetic flux density (B), which is divided by the permeability of air to give the magnetic field strength (H), which is combined, by multiplication, with the width (b) of the slot (4).

Hall probes (M1, M2) are arranged in a fixed or movable manner in the slot (4). It is possible to determine the electric current distribution I(x) between the two x-positions in respect of magnitude and phase from the difference between 2 measured values H1 and H2 of the magnetic field strength (H), measured by means of the Hall probes (M1) and (M2). One or more conductor elements (W1nl, W1nr; W2nl, W2nr) can be arranged between the Hall probes (M1, M2) in the x-direction. In order to be able to distinguish between the currents (i) in the different conductor elements (W1nl, W1nr; W2nl, W2nr), there is provided for each conductor element pillar a measurement location at a suitable position along the conductors.

Obviously, numerous modifications and variations of the present invention are possible in light of the above teachings. It is therefore to be understood that within the scope of the appended claims, the invention may be practised otherwise than as specifically described herein.

What is claimed as new and desired to be secured by Letters Patent of the United States is:

1. An apparatus for detection of electric current distribution I(x) within at least one conductor of an electric machine, which conductor is arranged in a slot of the electric machine said apparatus comprising:

a probe holder having cross-sectional dimensions selected relative to cross-sectional dimensions of the slot to provide for movement of said apparatus within the slot; and at least one magnetic field probe included within said probe holder for arrangement in the slot between the at least one conductor and a slot wall upon movement of the probe holder within the slot.

2. The apparatus as claimed in claim 1, comprising at least 2 magnetic field probes having an adjustable mutual center-to-center distance.

3. The apparatus as claimed in claim 1, wherein the at least one magnetic field probe is arranged for radial movement in the slot of the electric machine.

4. The apparatus as claimed in claim 1, wherein said probe holder is formed with an electrically insulating material, the at least one magnetic field probe being accommodated in a recess of the probe holder, and said probe holder being configured for radial movement in a probe channel which is radial with regard to the electric machine.

5. The apparatus as claimed in claim 1, wherein the at least one conductor further includes:

a plurality of mutually insulated and transposed conductor elements.

* * * * *